(12) United States Patent
Eppich et al.

(10) Patent No.: US 9,128,383 B2
(45) Date of Patent: *Sep. 8, 2015

(54) SUB-RESOLUTION ASSIST DEVICES AND METHODS

(71) Applicant: Micron Technology, Inc., Boise, ID (US)

(72) Inventors: Anton P. Eppich, Boise, ID (US); Fei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/274,455

(22) Filed: May 9, 2014

(65) Prior Publication Data

US 2014/0248554 A1 Sep. 4, 2014

Related U.S. Application Data

(60) Division of application No. 13/158,726, filed on Jun. 13, 2011, now Pat. No. 8,736,811, which is a continuation of application No. 11/745,242, filed on May 7, 2007, now Pat. No. 7,961,292.

(51) Int. Cl.
*G03B 27/42* (2006.01)
*G03F 1/00* (2012.01)
*G03F 1/38* (2012.01)
*G03F 7/20* (2006.01)

(52) U.S. Cl.
CPC ...... *G03F 1/38* (2013.01); *G03B 27/42* (2013.01); *G03F 7/70058* (2013.01); *G03F 7/70283* (2013.01); *G03F 7/70433* (2013.01)

(58) Field of Classification Search
CPC .... G03F 7/70058; G03F 7/70341; G03F 1/38; G03F 7/70283
USPC ................................. 355/53, 67, 55; 430/5
See application file for complete search history.

(56) References Cited

U.S. PATENT DOCUMENTS

| | | | |
|---|---|---|---|
| 4,890,309 A * | 12/1989 | Smith et al. ............ | 378/35 |
| 6,528,216 B2 | 3/2003 | Park | |
| 7,339,652 B2 | 3/2008 | Moukara et al. | |
| 7,961,292 B2 | 6/2011 | Eppich et al. | |
| 8,736,811 B2 | 5/2014 | Eppich et al. | |
| 2004/0248018 A1 | 12/2004 | Kang et al. | |
| 2006/0103825 A1 | 5/2006 | Kondo | |
| 2006/0181691 A1 | 8/2006 | Moukara et al. | |

(Continued)

OTHER PUBLICATIONS

Brunner, Timothy A., "Impact of Lens Aberrations on Optical Lithography", IBM J. Res. Develop. 41(1/2), (Jan./Mar. 1997), pp. 57-67.

*Primary Examiner* — Peter B Kim
(74) *Attorney, Agent, or Firm* — Schwegman Lundberg & Woessner, P.A.

(57) ABSTRACT

Photolithographic apparatus, systems, and methods that make use of sub-resolution assist devices are disclosed. In the various embodiments, an imaging mask includes an optically transmissive substrate having a sub-resolution assist device that further includes a first optical attenuation region and a spaced-apart second optical attenuation region, and an optically transmissive phase adjustment region interposed between the first optical attenuation region and the second optical attenuation region, the phase adjustment region being configured to change a phase of incident illumination radiation by altering an optical property of the substrate.

20 Claims, 7 Drawing Sheets

(56) References Cited

U.S. PATENT DOCUMENTS

2007/0238032 A1 10/2007 Murano
2008/0278700 A1 11/2008 Eppich et al.
2011/0235009 A1 9/2011 Eppich et al.

\* cited by examiner

SUB-RESOLUTION ASSIST DEVICES AND METHODS

PRIORITY APPLICATION

This application is a divisional of U.S. application Ser. No. 13/158,726, filed Jun. 13, 2011, which is a continuation of U.S. application Ser. No. 11/745,242, filed on May 7, 2007, now issued as U.S. Pat. No. 7,961,292, which are incorporated herein by reference in their entirety.

TECHNICAL FIELD

The embodiments disclosed herein relate generally to photolithographic devices and methods, including assist features for photolithographic masks used in sub-resolution photolithography.

BACKGROUND

The incorporation of increasing numbers of discrete devices into progressively smaller integrated circuits remains an important challenge in the manufacture of Very Large Scale Integration (VLSI) structures. For example, the implementation of CMOS technology into integrated circuits usually involves imparting a prescribed set of manufacturing attributes to the integrated circuit, which may include selected dopant concentrations, channel lengths, interconnect dimensions, contact shapes, or other pertinent attributes, which collectively permit the integrated circuit to provide a desired function.

Many of the desired features in VLSI structures may be formed using photolithographic methods. Briefly, and in general terms, a photolithographic mask (or reticle) is formed that includes a desired pattern corresponding to a particular masking step for the structure. The pattern generally includes optically transparent areas and optically opaque areas that are suitably arranged on an optically transparent supporting substrate. The mask may then be interposed between an illumination system and a layer of an illumination-sensitive photoresist material applied to a semiconductor wafer. The illumination system projects illumination radiation through the optically transparent portions of the mask and onto the photoresist material, which suitably changes the properties of the photoresist material. Subsequent development of the exposed photoresist material thus permits the selective differentiation between exposed and non-exposed areas in the photoresist material so that the desired pattern may be subsequently formed on the semiconductor wafer.

When a wavelength of the illumination radiation is greater than a minimum feature size expressed on the mask, various optical effects may adversely affect the quality of features formed on a semiconductor structure. For example, edges between transparent areas and opaque areas generally leads to diffractive effects, which generally causes constructive interference when the waves of the illumination radiation are bent and re-radiated, resulting in exposure reduction in areas corresponding to the transparent areas of the mask, and undesired illumination in areas corresponding to opaque portions of the mask. As feature densities in semiconductor structures increase (and correspondingly, feature sizes decrease), diffractive effects, as well as other optical effects become more prominent limiting factors in photolithography.

Accordingly, various compensation methods are available that may increase the pattern fidelity in the structure. For example, in one known method, optical proximity correction (OPC) may be used to perturb the shapes of transmitting apertures, or other features on the mask to enhance optical resolution in the sub-wavelength regime. In general, the perturbed features on the mask are sub-resolution features since they are generally not printed onto the structure during the exposure process. Accordingly, these features are collectively referred to as sub-resolution assist features. Examples of sub-resolution assist features may include "serifs" to reduce corner rounding in the features formed in the structure, and "hammerheads" to reduce the shortening of end line features. Other sub-resolution assist features may include scattering bars, or "outriggers", and "inriggers" that improve line width control in the structure. Still other methods may be used to improve the resolution of features in the sub-resolution regime. For example, Phase Shift Masking (PSM) methods generally enable transparent regions on the mask to transmit phase-shifted illumination to the structure in order to reduce destructive interference that may occur between transparent areas that are separated by an opaque area on the mask. Still other methods may be directed to the illumination system itself. For example, an incident radiation angle (a) and/or the numerical aperture (NA) of a projection lens may be suitably configured to resolve relatively dense lines and spaces.

Although the foregoing methods constitute improvements in the state of the art that permit aggressive reductions in feature size, still other arrangements of features may introduce resolution problems that are not fully addressed by the foregoing methods. For example, desired features that include isolated and semi-isolated regions, such as lines or spaces, may not be adequately addressed by the foregoing methods. Therefore, what is needed in the art are sub-resolution assist methods and structures that permit the formation of these features.

BRIEF DESCRIPTION OF THE DRAWINGS

Various embodiments of the invention are described in detail below with reference to the following drawings.

DETAILED DESCRIPTION

Various embodiments of the invention include photolithographic devices having sub-resolution assist features for photolithographic masks used in photolithography, and methods for forming and using such sub-resolution assist features. Many specific details of several embodiments of the invention are set forth in the following description and in FIGS. 1 through 11 to provide a thorough understanding of such embodiments. One of ordinary skill in the art, however, will understand that additional embodiments are possible, and that many embodiments may be practiced without several of the details described in the following description. In the description that follows, the term "sub-resolution assist device" or "sub-resolution assist feature" may be construed to include various sub-resolution features known by various terms of art, such as "inriggers", "outriggers", "phase shift masks", "sidelobe suppression boxes", and other terms.

Figure 1:
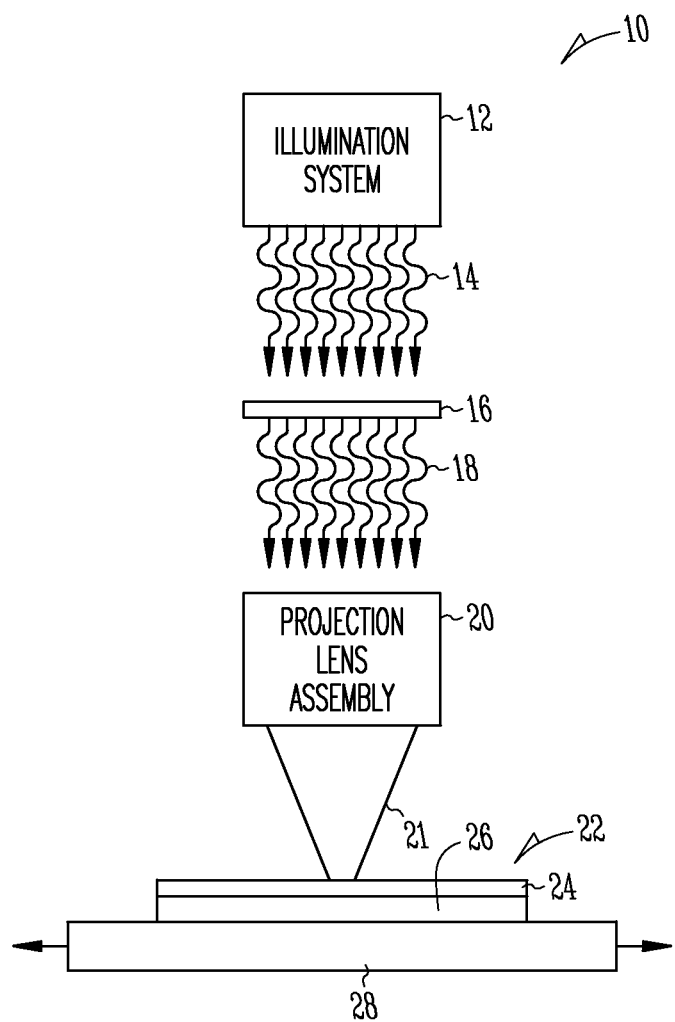
FIG. 1 is a diagrammatic block view of a photolithography system according to the various embodiments.

FIG. 1 is a diagrammatic block view of a photolithography system 10, according to the various embodiments. The system 10 includes an illumination system 12 that is configured to emit illumination radiation 14 that may be used for photolithographic imaging. Accordingly, the system 10 may include illumination sources that are operable to generate radiation 14 in the deep ultraviolet (DUV) portion of the spectrum, such as an excimer laser. Suitable excimer laser sources may include a xenon-fluoride (XeF) device that emits radiation at a wavelength of 351 nanometers (nm), a xenon-chloride (XeCl) device that emits radiation at a wavelength of 308 nm, a krypton-fluoride (KrF) device that emits radiation at a wavelength of 248 nanometers (nm), and an argon-fluoride (ArF) that emits radiation at a 193 nm wavelength. Other suitable illumination sources may include mercury-arc sources that emit at wavelengths of 365 nm to 257 nm, depending on the spectral line selected. Other wavelengths may be used.

The illumination system 12 may also include devices that provide off-axis illumination corresponding to a selected illumination mode. For example, suitable devices may be configured to generate a dipole-type illumination mode, an annular illumination mode, a two-pole illumination mode, a four pole illumination mode, or still other illumination modes. The illumination system 12 may also include other optical devices that are operable to produce illumination radiation 14 having a desired intensity and/or distribution.

The illumination system 12 may be suitably positioned relative to an imaging mask 16, so that the illumination radiation 14 emitted from the system 12 is projected onto the imaging mask 16. The imaging illumination 18 corresponds to the radiation 14 that is selectively transmitted by the imaging mask 16. The imaging mask 16 may include a transparent substrate material, such as a fused quartz substrate, although other suitable materials, such as soda-lime glass and borosilicate glass may also be used.

The imaging mask 16 may also include opaque areas formed from various compounds that may include selected combinations of chromium, oxygen and nitrogen. Alternatively, the opaque areas may also include selected combinations of molybdenum, silicon, oxygen and nitrogen. Other suitable materials are known in the art, which may also be used to form the opaque areas on the transparent substrate material. The mask 16 may also include phase-shifting regions according to the various embodiments, as will be discussed in greater detail below.

Still referring to FIG. 1, the system 10 may further include a projection lens assembly 20 that is configured to collect the imaging illumination 18 and form focused imaging illumination 21 therefrom. The focused imaging illumination 21 may then be directed onto an in-process semiconductor structure 22. The structure 22 may include a photoresist layer 24 that is responsive to the illumination 21, which is applied to a surface of a semiconductor wafer 26. Since the photoresist layer 24 may be repetitively exposed to the focused imaging illumination 21 to form separately exposed areas on the wafer 26, the semiconductor structure 22 may be positioned upon a stage 28 that may be translated in one or more of several (e.g., three) mutually-orthogonal directions.

Figure 2:
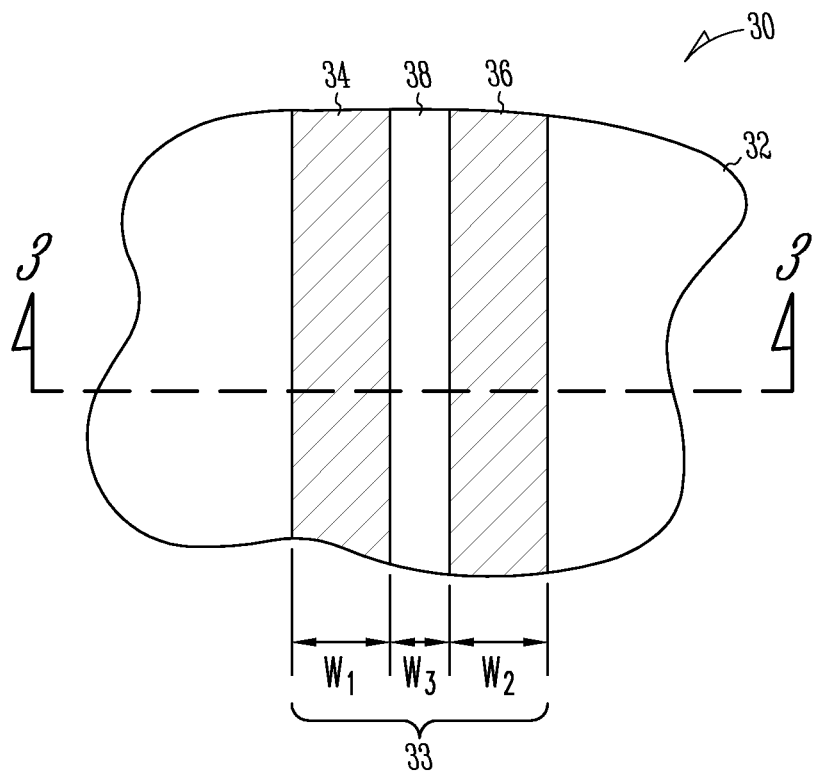
FIG. 2 is a partial plan view of an imaging mask according to the various embodiments.

FIG. 2 is a partial plan view of an imaging mask 30 according to the various embodiments. The imaging mask 30 includes a substantially plane-parallel and optically transparent substrate 32 that may include one or more layers disposed on a surface of the substrate 32. For example, the substrate 32 may include at least one of a radiation-absorbing layer comprising chromium and/or tantalum, and a molybdenum silicide layer that provides a predetermined reflectance to incident illumination radiation 14 (as shown in FIG. 1). Other layers may be provided, such as a backside coating that protects an opposing side of the substrate 32 from damage resulting from contact with the stage 28 (as also shown in FIG. 1), and a resist layer to assist in the formation of features on the substrate 32. One suitable substrate 32 is the Full EUV mask blank, which may be obtained from Schott Lithotec USA of Poughkeepsie, N.Y., although other suitable alternatives exist.

The imaging mask 30 also includes at least one sub-resolution assist device 33 having a first attenuating region 34 and a second attenuating region 36 disposed on the substrate 32. The first attenuating region 34 and a second attenuating region 36 may be substantially opaque to substantially attenuate the incident focused imaging illumination 21 (as shown in FIG. 1), or may be partially optically transmissive to partially attenuate the incident focused imaging illumination 21. The first attenuating region 34 and the second attenuating region 36 may be formed to have a first width $w_1$, and a second width $w_2$, respectively. Alternately, the first width $w_1$, and the second width $w_2$ may be substantially equivalent. In either case, the first attenuating region 34 and the second attenuating region 36 may substantially comprise molybdenum silicide (MoSi) that is uniformly deposited onto a surface of the substrate 32 to a suitable thickness by sputtering, or other known processes, and patterned using an electron beam (e-beam), a laser, or other devices that are operable to generate a pattern on the substrate 32 that corresponds to a functional feature on the wafer 26 (as also shown in FIG. 1).

The at least one sub-resolution assist device 33 on the imaging mask 30 may include a phase adjustment region 38 that is interposed between the first attenuating region 34 and the second attenuating region 36 that is configured to alter an optical property of the substrate 32. For example, the optical property may be altered by changing an optical path length through the substrate 32, and/or altered by changing a material property of the of the substrate 32 in the phase adjustment region 38, such as changing an index of refraction, or changing an optical transmissibility, or by changing still other physical properties of the substrate 32 in the phase adjustment region 38. In any case, the phase adjustment region 38 may be formed to have a third width $w_3$, which may be equal to a selected one of the first width $w_1$, and the second width $w_2$, or it may have a different width from either of the first width $w_1$, and the second width $w_2$. The phase adjustment region 38 may be suitably configured to alter a phase of the incident radiation. For example, the phase adjustment region 38 may be configured to provide a phase shift that is greater than approximately zero degrees (zero radians), but less than approximately 180 degrees ($\pi$ radians). The phase adjustment region 38 may also be configured to provide a phase shift that is greater than approximately 180 degrees (it radians), but less than approximately 360 degrees ($2\pi$ radians). In other of the various embodiments, the phase adjustment region 38 is operable to shift the phase of the illumination radiation 14 (FIG. 1) by approximately about 90 degrees (π/2 radians). The phase adjustment region 38 will be discussed in further detail below.

Figure 3:
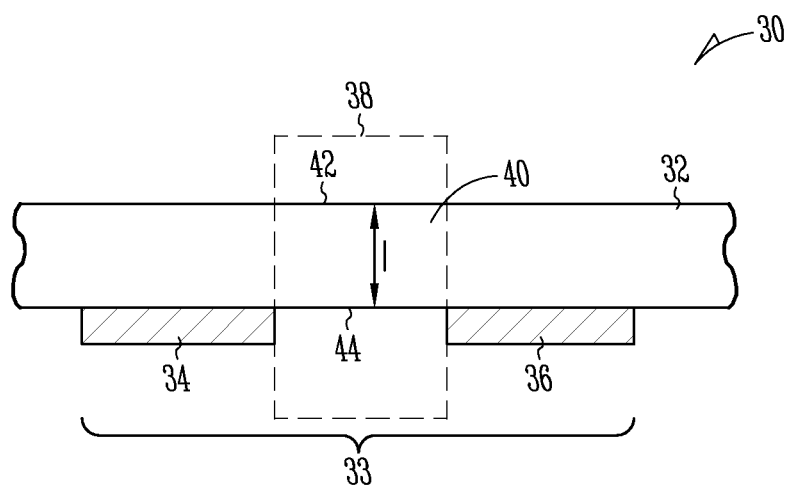
FIG. 3 is a partial cross-sectional view of the imaging mask along the cross section 3-3 indicated in FIG. 2.

FIG. 3 is a partial cross-sectional view of the imaging mask 30 along the cross section 3-3 indicated in FIG. 2, which will be used to further describe the sub-resolution assist device 33. The phase adjustment region 38 may be incorporated into various portions of a substrate portion 40 that is positioned between the first attenuating region 34 and the second attenuating region 36. For example, the phase adjustment region 38 may be positioned on a first surface 42 of the substrate portion 40, and/or on a second surface 44 so that the optical path length l in the region 38 is increased in comparison to an optical path through an unaltered substrate portion 40. In other of the various embodiments, the phase adjustment region 38 may also include portions that extend inwardly into the substrate portion 40 to form recesses projecting into at least one of the first surface 42 and the second surface 44, so that the optical path length l is decreased in comparison to an optical path through an unaltered substrate portion 40. In still other of the various embodiments, the phase adjustment region 38 may include physically altering the substrate portion 40 so that a predetermined optical property within the substrate portion 40 is changed.

Figure 4:
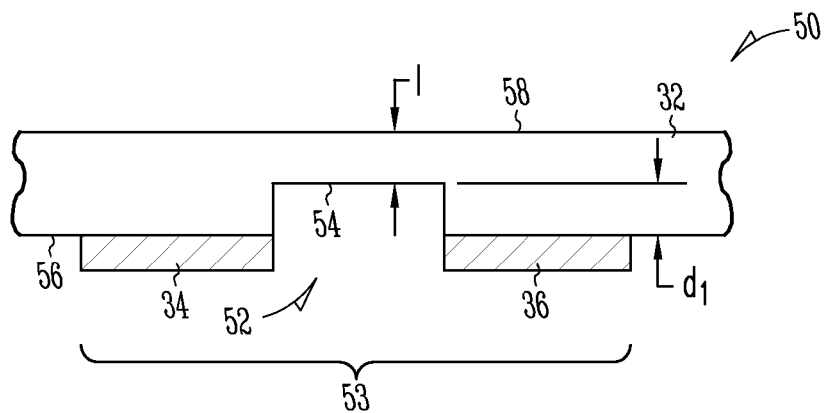
FIG. 4 is a partial cross-sectional view of an imaging mask according to the various embodiments.

FIG. 4 is a partial cross-sectional view of an imaging mask 50 according to the various embodiments. The imaging mask 50 includes at least one sub-resolution assist device 53 having a phase adjustment region 52 that projects inwardly into the substrate 32 a distance $d_1$ from a first side 56 that also includes the first attenuating region 34 and the second attenuating region 36. Accordingly, an inner optical surface 54 is formed within the substrate 32, which may be positioned at a predetermined position between the first side 56 and a second side 58 of the substrate 32 to provide a negative phase shift relative to a phase of the illumination radiation 14 (see FIG. 1).

In general, a distance d for the sub-resolution phase adjustment region 52 may be determined using the following expression:

$$d = 2\lambda/\pi(n-1) \quad (1)$$

where n is the index of refraction for the substrate 32, λ corresponds to a wavelength of the illumination radiation 14 (as shown in FIG. 1), and M corresponds to a magnification factor, which is typically approximately four, although other values may be suitable. The inner optical surface 54 may be formed using either a wet etch or a dry etch method. For example, the inner optical surface 54 may be formed using a plasma etch process, although other suitable methods may also be used.

Figure 5:
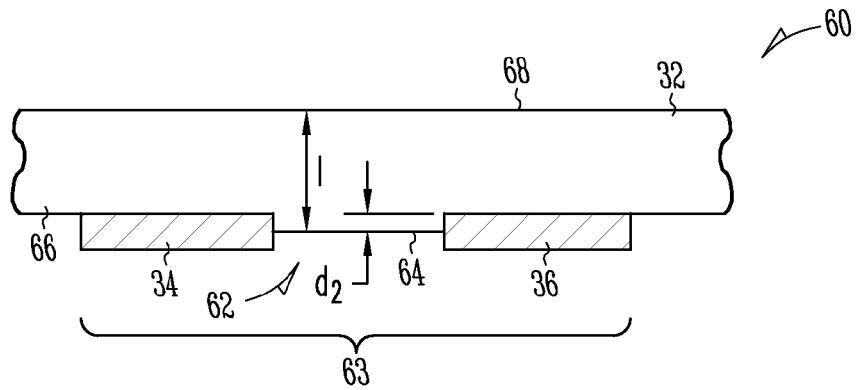
FIG. 5 is a partial cross-sectional view of another imaging mask according to the various embodiments.

FIG. 5 is a partial cross-sectional view of another imaging mask 60 according to the various embodiments. The imaging mask 60 includes at least one sub-resolution assist device 63 having a phase adjustment region 62 that projects outwardly from the substrate 32 a distance $d_2$ from a first side 66 that also includes the first attenuating region 34 and the second attenuating region 36. An outer optical surface 64 is thus formed, which provides a positive phase shift relative to a phase of the illumination radiation 14 applied to the imaging mask 60. The distance $d_2$ for the sub-resolution phase adjustment region 62 may be determined using the expression (1) given above. The outer optical surface 64 may be formed using various deposition processes known in the art.

Figure 6:
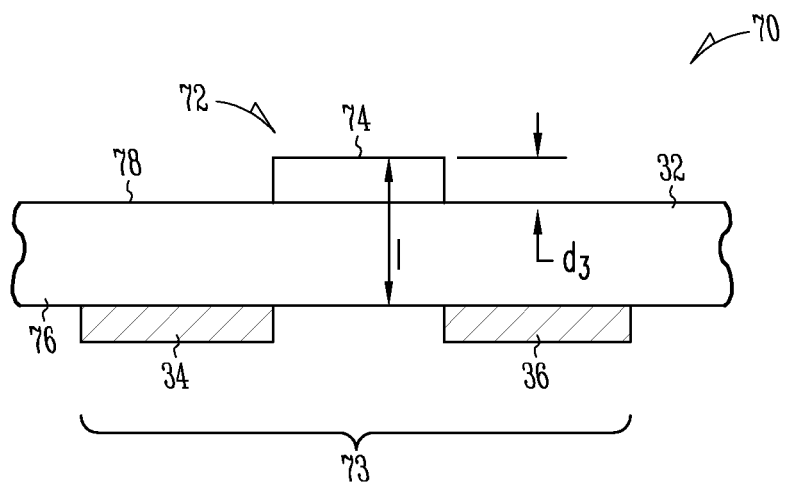
FIG. 6 is a partial cross-sectional view of still another imaging mask according to the various embodiments.

FIG. 6 is a partial cross-sectional view of still another imaging mask 70 according to the various embodiments. The imaging mask 70 may include at least one sub-resolution assist device 73 having a phase adjustment region 72 that projects outwardly from the substrate 32 a distance $d_3$ from a second side 78 that opposes a first side 76 of the imaging mask 70, which includes the first attenuating region 34 and the second attenuating region 36. An outer optical surface 74 is thus formed, which also provides a positive phase shift relative to a phase of the illumination radiation 14 applied to the imaging mask 70. The distance $d_3$ for the sub-resolution phase adjustment region 72 may similarly be determined using the expression (1) given above.

Figure 7:
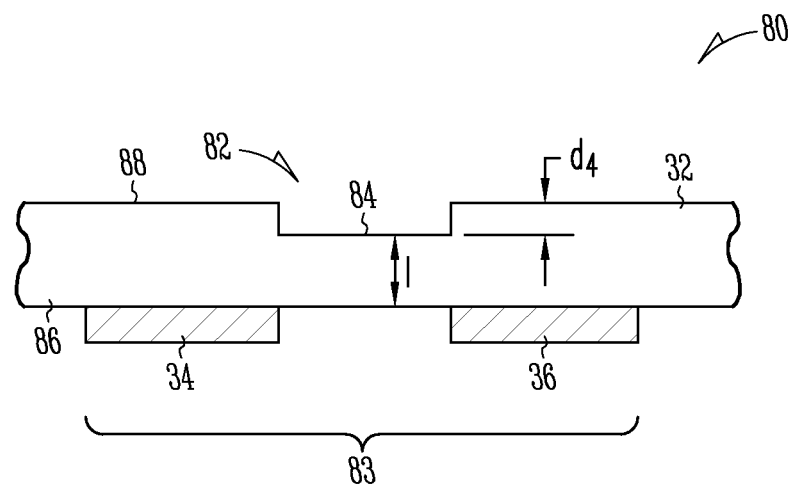
FIG. 7 is a partial cross-sectional view of still yet another imaging mask according to the various embodiments.

FIG. 7 is a partial cross-sectional view of still yet another imaging mask 80 according to the various embodiments. The imaging mask 80 may also include at least one sub-resolution assist device 83 that includes a phase adjustment region 82 that projects inwardly into the substrate 32 a distance $d_4$ from a second side 88 that opposes a first side 86 that includes the first attenuating region 34 and the second attenuating region 36. An optical surface 84 is thus formed, which provides a negative phase shift relative to a phase of the illumination radiation 14 applied to the imaging mask 60. The distance $d_4$ for the sub-resolution phase adjustment region 82 may also be determined using the expression (1) given above.

Figure 8:
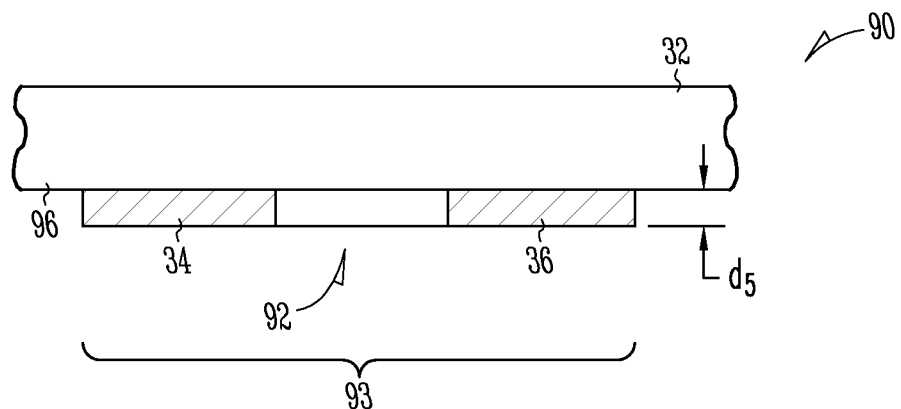
FIG. 8 is a partial cross-sectional view of an imaging mask according to the various embodiments.

FIG. 8 is a partial cross-sectional view of an imaging mask 90 according to the various embodiments. The imaging mask 90 may include at least one sub-resolution assist device 93 that includes a phase adjustment region 92 that projects outwardly from the substrate 32 a distance $d_5$ from a first side 96 that includes the first attenuating region 34 and the second attenuating region 36. The distance $d_5$ may be approximately equal to a thickness of the first attenuating region 34 and the second attenuating region 36, or it may be greater, or less than the thickness of the first attenuating region 34 and the second attenuating region 36. In either case, the phase adjustment region 92 may be formed from a material having an optical property that differs from an optical property of the substrate 32. For example, the phase adjustment region 92 may include a second index of refraction that differs from a first index of refraction of the substrate 32. The sub-resolution phase adjustment region 92 may also include a second transmissibility that differs from a first transmissibility of the substrate 32. Accordingly, the phase adjustment region 92 may be operable to provide a positive or a negative phase shift relative to a phase of the illumination radiation 14 applied to the imaging mask 60, depending upon a material selected for the sub-resolution phase adjustment region 92.

Figure 9:
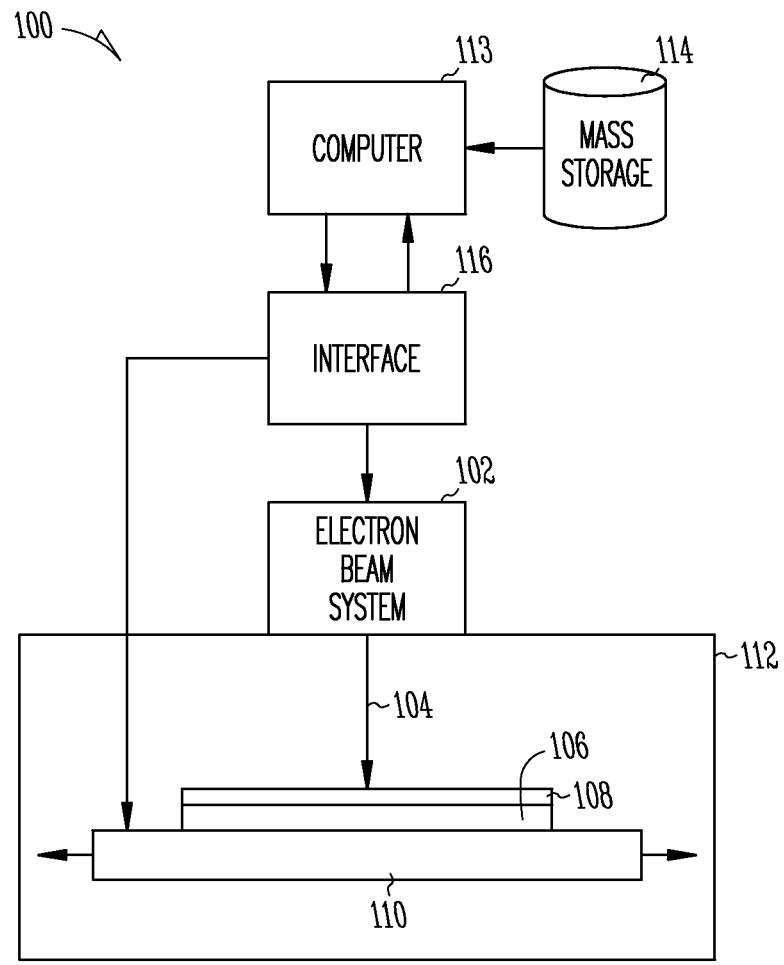
FIG. 9 is a diagrammatic block view of a mask exposure system, according to the various embodiments.

FIG. 9 is a diagrammatic block view of a mask exposure system 100, according to the various embodiments. The mask exposure system 100 may be used to fabricate an imaging mask that includes at least one of the sub-resolution assist devices according to the various embodiments. The system 100 includes an electron beam system 102 that projects an electron beam 104 towards an imaging mask blank 106 that may have at least one surface coating 108, such as a photoresist layer 108. Although not shown in FIG. 9, the electron beam system 102 may also include a beam source (such as a thermionic source, or a cold cathode source), a blanker that is configured to interrupt the beam source, a magnetic beam deflection system and/or an electrostatic deflection system that is configured to steer the electron beam 104 across a selected surface portion of the imaging mask blank 106. Since the magnetic beam deflection system and/or the electrostatic deflection system may be unable to steer the electron beam to all portions of the mask blank 106, the blank 106 may be positioned upon a stage 110 that may be translated in one or more of several (e.g., three) mutually-orthogonal directions. The system 100 may also include a vacuum chamber 112 that substantially encloses the imaging mask blank 106 and the stage 110, so that the beam 104 may be directed from the electron beam system 102 to the mask blank 106.

The system 100 also includes a computer 113, which may include any device that is capable of receiving data and programmed instructions, and to process the data according to the received instructions. Accordingly, the computer 113 may include various known devices that may range in size and capability between a mainframe device and a portable, or "laptop" device. The computer may be coupled to a mass storage device 114 that may provide instructions and data to the computer 113. For example, the mass storage device 114 may include a disk storage device, although other suitable mass storage devices may also be used. Accordingly, the device 114 may be used to store patterning instructions, which may be executed by the computer 113 to form a desired pattern on the imaging mask blank 106.

Still referring to FIG. 9, the system 100 may include an interface 116 coupled to the computer 113 and configured to receive instructions from the computer 113. The interface 116 may be configured to translate instructions received from the computer 113 and convert the received instructions into signals that may be used to control the electron beam system 102, and to further control movements of the stage 110. Accordingly, the computer 113 and the interface 116 may cooperatively control scanning of the electron beam 104 across the surface of the imaging mask blank 106. Suitable scanning methods may include raster-scanning and vector scanning the imaging mask blank 106.

Although the system 100 is configured to suitably pattern the imaging mask blank 104 by exposing the surface coating 108 to the electron beam 104, the vacuum chamber 112 may be configured to include other operations associated with the fabrication of the imaging mask 16 (as shown in FIG. 1), such as etching with an etching apparatus (not shown in FIG. 9) that is operable to selectively etch the substrate 32 in the phase adjustment region (as shown in FIGS. 2-8). A material deposition apparatus (not shown) may also be incorporated into the system 100, so that a selected material may be deposited onto the substrate 32 in the phase adjustment region. Alternately, the system 100 may be configured to expose the imaging mask blank 106 only, with the foregoing etching and/or material deposition processes being performed at other locations.

Figure 10:
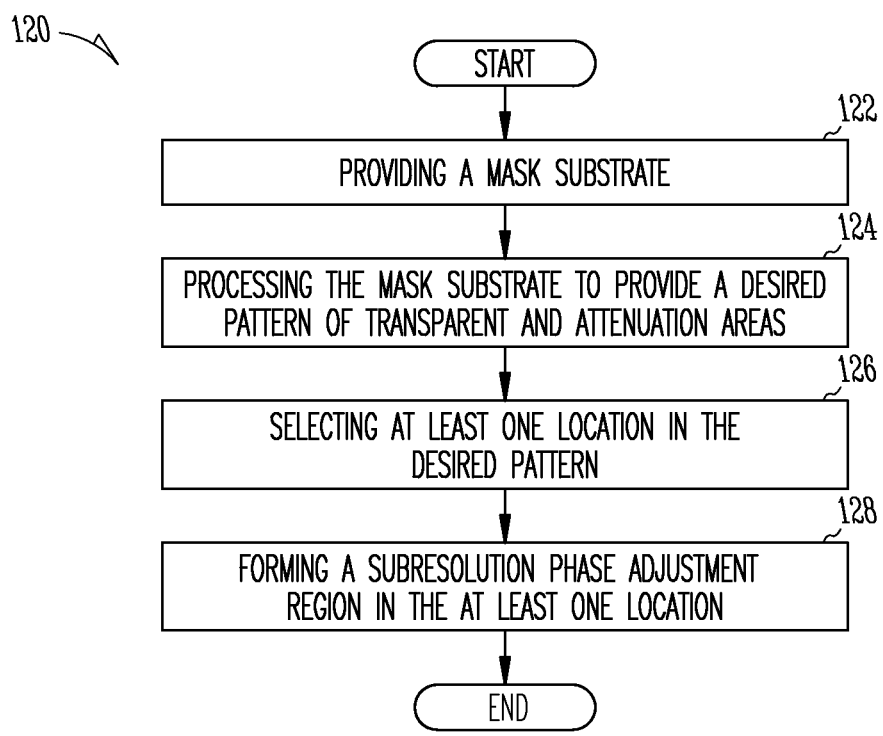
FIG. 10 is a flowchart that will be used to describe a method of manufacturing an imaging mask, according to the various embodiments.

FIG. 10 is a flowchart that will be used to describe a method 120 of manufacturing an imaging mask, according to the various embodiments. With continuing reference also to FIG. 9, the method 120 includes a block 122, wherein an imaging mask blank 106 is provided to the system 100. The imaging mask blank 106 may comprise glass having various chemical compositions, such as quartz, or other similar materials, and may also include one or more surface layers, including metal and/or silicide layers, such as a molybdenum silicide layer, as previously described. The one or more surface layers may also include a suitable photoresist layer. At block 124, the imaging mask blank 106 is processed to provide a desired pattern of transparent and opaque areas on the imaging mask blank 106. Accordingly, processing the imaging mask blank 106 may include exposing a surface of the imaging mask blank 106 to an electron beam provided by the mask exposure system 100, and developing exposed photoresist on the imaging mask blank 106 to form a desired pattern of transparent and opaque (and/or semi-opaque) areas that functionally correspond to a desired pattern of features on the wafer 26 (as shown in FIG. 1). At block 126, at least one location on the desired pattern of transparent and opaque areas may be selected for forming a sub-resolution assist device as is described in connection with FIGS. 2-8. At block 128, the sub-resolution assist device is formed on the imaging mask blank 106 at the at least one location identified at block 126.

Accordingly, the sub-resolution assist device may be formed by providing a phase adjustment region by selectively etching the imaging mask blank 106, or by selectively depositing a material onto the imaging mask blank 106, or by a predetermined combination of etching and deposition processes. As previously described, the processes conducted in block 128 may be performed within a vacuum chamber 112 of the system 100.

Figure 11:
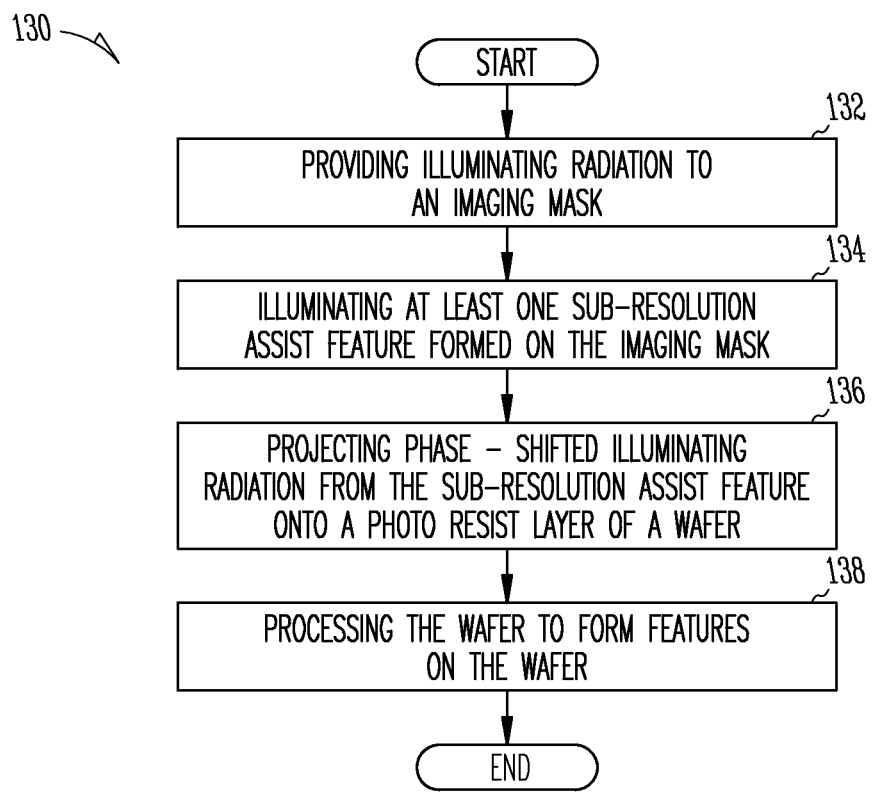
FIG. 11 is a flowchart that will be used to describe a photolithographic method, according to the various embodiments.

FIG. 11 is a flowchart that will be used to describe a photolithographic method 130, according to the various embodiments. Referring also again to FIG. 1, at block 132, illuminating radiation 14 is provided to an imaging mask 16 that includes at least one of the sub-resolution assist devices shown in FIGS. 2-8. The illuminating radiation 14 may be provided by a deep ultraviolet (DUV) source, such as an excimer laser, or it may be provided by other suitable illumination sources. At block 134, the at least one sub-resolution assist device in the imaging mask 16 is illuminated. Accordingly, phase-adjusted imaging illumination 18 is projected from the phase adjustment region of the assist device and onto a photoresist layer 24 of semiconductor wafer 26 to expose the photoresist layer 24. The phase-adjusted imaging illumination 18 may be focused through a projection lens assembly 20, as previously described. At block 138, the exposed photoresist layer 24 and the wafer 26 are suitably processed to generate the desired features on the wafer 26.

While the various embodiments of the invention have been illustrated and described, as noted above, many changes can be made without departing from the scope of this disclosure. Further, the certain foregoing embodiments of the sub-resolution phase adjustment region and imaging masks may be used in the fabrication of a wide variety of semiconductor devices, which may include semiconductor memory devices, including in particular, a static memory, a dynamic memory such as a DRAM, an extended data out dynamic random access memory (EDO DRAM), a synchronous dynamic random access memory, a double data rate synchronous dynamic random access memory (DDR SDRAM), a synchronous link dynamic random access memory (SLDRAM), a video random access memory (VRAM), a rambus dynamic random access memory (RDRAM), a static random access memory (SRAM), a flash memory, as well as other known memory devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An imaging mask, comprising:
a sub-resolution assist device comprising
a first optical attenuation region spaced-apart from a second optical attenuation region, the first optical attenuation region and the second optical attenuation region disposed on a first side of an optically transmissive substrate, and
an optically transmissive phase adjustment region positioned between the first optical attenuation region and the second optical attenuation region, and projecting outwardly a projection distance from a second side of the substrate opposing the first side of the substrate.

2. The imaging mask of claim 1, wherein the first optical attenuation region and the second optical attenuation region are at least partially optically transmissive.

3. The imaging mask of claim 1, wherein at least one of the first optical attenuation region or the second optical attenuation region are formed of molybdenum silicide (MoSi).

4. The imaging mask of claim 1, wherein the first optical attenuation region has a first width, the second optical attenuation region has a second width, and the phase adjustment region has a third width, and wherein the first width is approximately equal to the second width.

5. The imaging mask of claim 4, wherein the third width is approximately equal to at least one of the first width or the second width.

6. The imaging mask of claim 1, wherein the first optical attenuation region has a first height, and wherein the second optical attenuation region has a second height approximately equal to the first height.

7. The imaging mask of claim 6, wherein the projection distance is greater than at least one of the first height or the second height.

8. The imaging mask of claim 6, wherein the projection distance is approximately equal to at least one of the first height or the second height.

9. The imaging mask of claim 6, wherein the projection distance is less than at least one of the first height or the second height.

10. A photolithography system, comprising:
an illumination system to emit illumination radiation towards a semiconductor wafer; and
an imaging mask interposed between the illumination system and the semiconductor wafer, the imaging mask comprising a sub-resolution assist device including
a first optical attenuation region spaced-apart from a second optical attenuation region, the first optical attenuation region and the second optical attenuation region disposed on a first side of an optically transmissive substrate, and
an optically transmissive phase adjustment region positioned between the first optical attenuation region and the second optical attenuation region, and projecting outwardly a projection distance from a second side of the substrate opposing the first side of the substrate.

11. The photolithography system of claim 10, wherein the illumination system comprises a deep ultraviolet source of the illumination radiation.

12. The photolithography system of claim 10, wherein the illumination system comprises a mercury-arc source of the illumination radiation.

13. The photolithography system of claim 10, further comprising:
a projection lens assembly positioned between the imaging mask and the semiconductor wafer.

14. An imaging mask, comprising:
a sub-resolution assist device comprising
a first optical attenuation region spaced-apart from a second optical attenuation region, the first optical attenuation region and the second optical attenuation region disposed on a first side of an optically transmissive substrate, and
an optically transmissive phase adjustment region positioned between the first optical attenuation region and the second optical attenuation region, and projecting inwardly a projection distance from a second side of the substrate opposing the first side of the substrate.

15. The imaging mask of claim 14, wherein the phase adjustment region is configured to change a phase of an illumination radiation by altering an optical path length of the substrate.

16. The imaging mask of claim 14, wherein the phase adjustment region comprises a material having an index of refraction that is different from an index of refraction of the substrate.

17. The imaging mask of claim 14, wherein the phase adjustment region comprises a material having a transmissibility that is different from a transmissibility of the substrate.

18. The imaging mask of claim 14, wherein the substrate comprises a thickness greater than the projection distance.

19. The imaging mask of claim 14, wherein the substrate comprises a thickness less than the projection distance.

20. A photolithography system, comprising:
an illumination system to emit illumination radiation towards a semiconductor wafer; and
an imaging mask interposed between the illumination system and the semiconductor wafer, the imaging mask comprising a sub-resolution assist device including
a first optical attenuation region spaced-apart from a second optical attenuation region, the first optical attenuation region and the second optical attenuation region disposed on a first side of an optically transmissive substrate, and
an optically transmissive phase adjustment region positioned between the first optical attenuation region and the second optical attenuation region, and projecting inwardly a projection distance from a second side of the substrate opposing the first side of the substrate.

* * * * *